United States Patent
Chu et al.

(10) Patent No.: US 10,775,427 B2
(45) Date of Patent: Sep. 15, 2020

(54) CIRCUIT BOARD FOR TRANSMITTING HIGH SPEED SIGNAL AND FOR SAID SIGNAL TO BE DETECTED

(71) Applicant: Wiwynn Corporation, New Taipei (TW)

(72) Inventors: Yu-Nan Chu, New Taipei (TW); Yung Jung Du, New Taipei (TW); Yi Tang Chen, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 134 days.

(21) Appl. No.: 16/150,455

(22) Filed: Oct. 3, 2018

(65) Prior Publication Data
US 2019/0369160 A1 Dec. 5, 2019

(30) Foreign Application Priority Data

May 30, 2018 (TW) .............................. 107118442 A

(51) Int. Cl.
*G01R 31/28* (2006.01)
*H05K 1/02* (2006.01)

(52) U.S. Cl.
CPC ....... *G01R 31/2812* (2013.01); *H05K 1/0242* (2013.01); *H05K 1/0243* (2013.01)

(58) Field of Classification Search
CPC . G01R 31/2812; H05K 1/0242; H05K 1/0243
See application file for complete search history.

(56) References Cited

U.S. PATENT DOCUMENTS

| 4,869,671 A * | 9/1989 | Pressley | ................. H01R 12/57 439/55 |
| 6,930,255 B2 * | 8/2005 | Wakihara | ............. H05K 1/0269 174/250 |

(Continued)

FOREIGN PATENT DOCUMENTS

| CN | 102065643 A | 5/2011 |
| TW | 200513766 A | 4/2005 |

(Continued)

OTHER PUBLICATIONS

Taiwan Patent Office, "Office Action", dated Nov. 7, 2018, Taiwan.
(Continued)

*Primary Examiner* — Tung X Nguyen
*Assistant Examiner* — Feba Pothen
(74) *Attorney, Agent, or Firm* — Locke Lord LLP; Tim Tingkang Xia, Esq.

(57) ABSTRACT

A circuit board for transmitting a high speed signal and for the high speed signal to be detected comprises a substrate, an insulating layer and two metal printed wires. The insulating layer is disposed on the substrate, and comprises a first surface, a second surface and a test opening, with the first surface facing away from the substrate, the second surface facing the substrate, and the test opening passing through the first surface and formed above the second surface. Said two metal printed wires are configured to transmit the high speed signal and embedded in the insulating layer between the first surface and the second surface. At least one of the metal printed wires comprises a test section which is aligned to the test opening of the insulating layer and exposed by the test opening.

11 Claims, 7 Drawing Sheets

(56) References Cited

U.S. PATENT DOCUMENTS

2005/0072597 A1    4/2005   Lee et al.
2007/0155156 A1    7/2007   Lee et al.
2010/0090715 A1    4/2010   Chang et al.
2010/0109993 A1    5/2010   Chang
2014/0002090 A1    1/2014   Wu et al.

FOREIGN PATENT DOCUMENTS

TW    201015187 A    4/2010
TW    201403167 A    1/2014
TW    201444007 A    11/2014

OTHER PUBLICATIONS

China Patent Office, "Office Action", dated Apr. 29, 2020, China.

* cited by examiner

CIRCUIT BOARD FOR TRANSMITTING HIGH SPEED SIGNAL AND FOR SAID SIGNAL TO BE DETECTED

CROSS-REFERENCE TO RELATED APPLICATIONS

This non-provisional application claims priority under 35 U.S.C. § 119(a) on Patent Application No(s). 107118442 filed in Taiwan, R.O.C. on May 30, 2018 the entire contents of which are hereby incorporated by reference.

BACKGROUND

Technical Field

This disclosure relates to a circuit board, and particularly to a circuit board for transmitting a high speed signal and for the high speed signal to be detected.

Related Art

A conventional electrical test of components and signals on a printed circuit board (PCB) involves an in-circuit test (ICT), a manufacturing defect analysis, and so on. A number of test blocks are set in the metal printed wires on the board, and these test blocks are contacted by one or more test probes for testing, so that it can detect whether there is an abnormal element on the PCB generated during the fabrication process.

In general, the line width of the metal printed wires for transmitting a high speed signal is in a range of 4 to 7 mil, and a conventional test block is a circular block with a diameter in a range of 28 to 35 mil. If this conventional test block is disposed on the metal printed wires for transmitting a high speed signal, the impedance of the region contacting the test block in the metal printed wires must be dramatically changed, so that the impedance of the metal printed wires must be inconsistent and the signal being transmitted must be reflected; thus, the transmission quality of the high speed signal, the stability of the whole device, and even the read/write speed must be decreased. Accordingly, the metal printed wires for transmitting a high speed signal won't be tested by the conventional ICT or MDA, but are tested by the subsequent functional test. The functional test belongs to an overall system test, which is performed on the entire system and the test objects (e.g. solid-state disk connected with bus interface in the peripheral components) after the fabrication of the entire circuit board is completed.

However, since the functional test is performed after the fabrication of the entire system is completed, the quantity of the components to be tested is large and complicated in this phase. Furthermore, in the production process of a general circuit board manufacturer, the circuit boards are fabricated at different times or on the different production lines depending on the various fabrication orders, so that the time required for fabricating the circuit boards varies, and it is quite difficult to test the high speed signal wires.

SUMMARY

According to an embodiment of this disclosure, a circuit board for transmitting a high speed signal and for the high speed signal to be detected comprises a substrate, an insulating layer and two metal printed wires. The insulating layer is disposed on the substrate, and comprises a first surface, a second surface and a test opening, with the first surface facing away from the substrate, the second surface facing the substrate, and the test opening passing through the first surface and formed above the second surface. Said two metal printed wires are configured to transmit the high speed signal and embedded in the insulating layer between the first surface and the second surface. At least one of the metal printed wires comprises a test section which is aligned to the test opening of the insulating layer and exposed by the test opening.

According to another embodiment of this disclosure, said two metal printed wires of the circuit board for transmitting a high speed signal and for the high speed signal to be detected comprises a first metal printed wire and a second metal printed wire. The first metal printed wire comprises the test section and a non-test section, wherein the non-test section of the first metal printed wire and the second metal printed wire are misaligned to the test opening, and the distance between the test section and the second metal printed wire is larger than that between the non-test section and the second metal printed wire.

According to yet another embodiment of this disclosure, said two metal printed wires of the circuit board for transmitting a high speed signal and for the high speed signal to be detected comprises a first metal printed wire and a second metal printed wire. Each of the first metal printed wire and the second metal printed wire comprises the test section and a non-test section, wherein the non-test section of the first metal printed wire and the non-test section of the second metal printed wire are misaligned to the test opening, the line width of the test section of the first metal printed wire is larger than that of the non-test section of the first metal printed wire, and the line width of the test section of the second metal printed wire is larger than that line width of the non-test section of the second metal printed wire.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
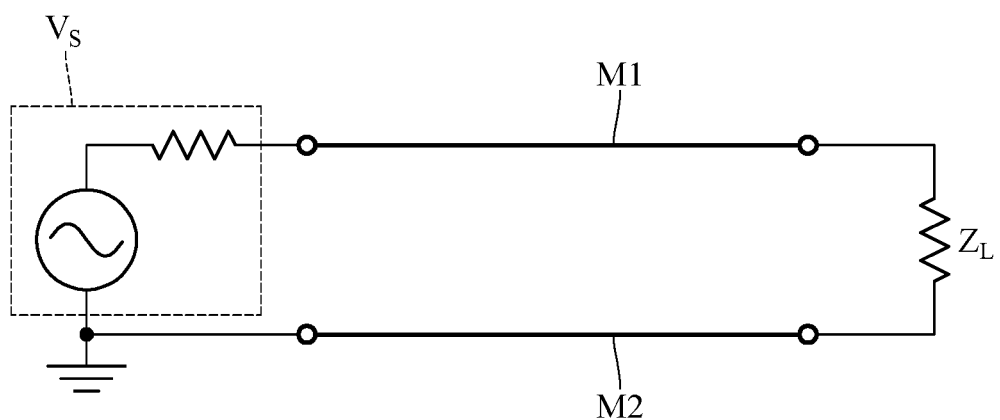
FIG. 1 is a circuit diagram of metal printed wires of a circuit board for transmitting a high speed signal and for the high speed signal to be detected according to an embodiment of this disclosure.

Please refer to FIG. 1 which is a circuit diagram of metal printed wires of a circuit board for transmitting a high speed signal and for the high speed signal to be detected according to an embodiment of this disclosure. As shown in FIG. 1, the circuit board for transmitting a high speed signal and for the high speed signal to be detected in this disclosure comprises two metal printed wires M1 and M2 belonging to differential signal wires (i.e. a pair of signal transmission wires composed of a positive signal wire and a negative signal wire). The metal printed wires M1 and M2 are configured to connect the voltage source VS and the load impedance ZL so as to transmit a high speed signal. In the process of the signal transmission, the metal printed wires M1 and M2 has the characteristic impedance. More particularly, in an example, the high speed signal is based on the standard of peripheral component interconnect express (PCIe), and its frequency is more than 2 GHz. In addition, the high speed signal can be based on the standard of serial attached SCSI (SAS), serial ATA (SATA), etc., which is not limited in this disclosure.

Figure 2A:
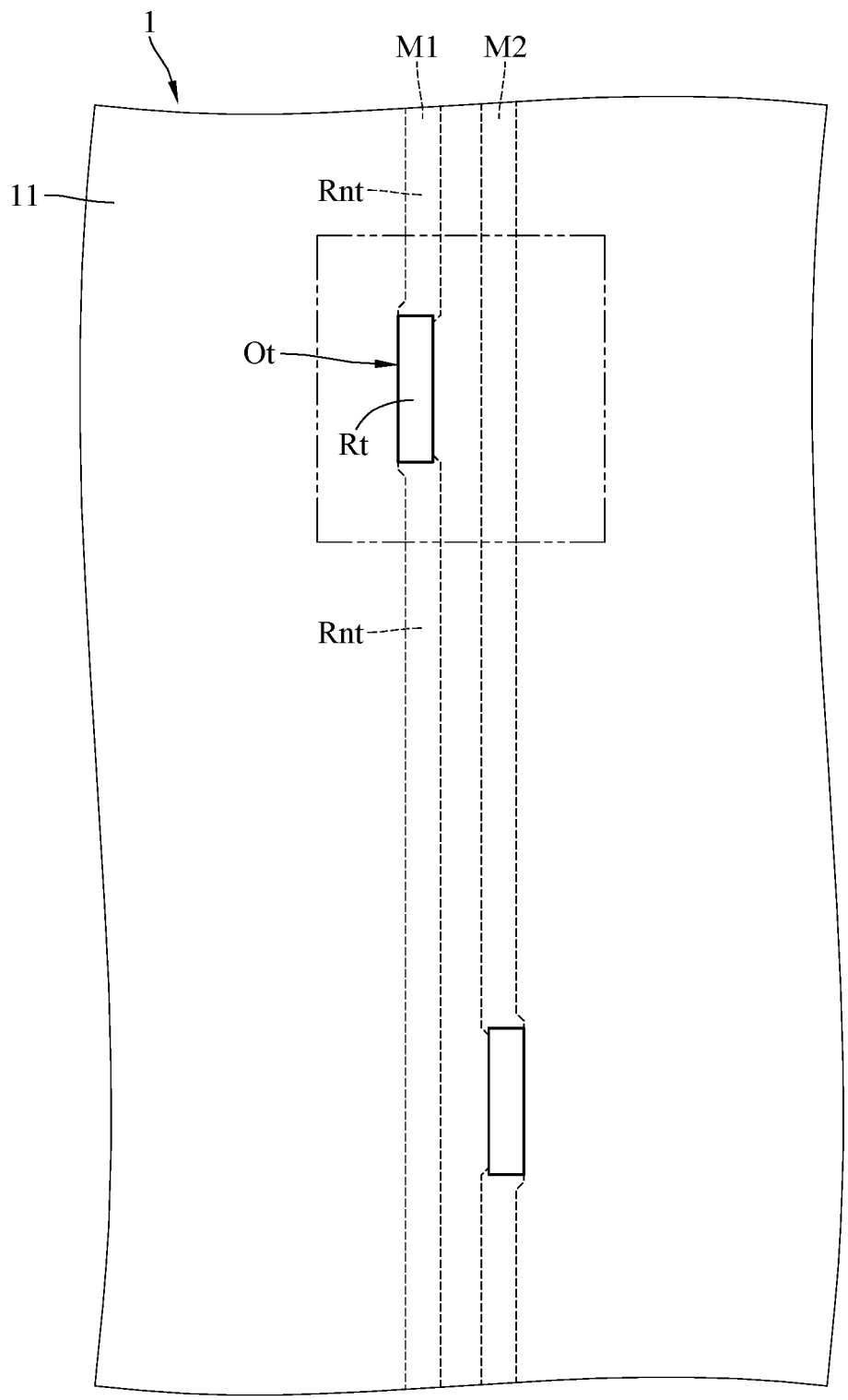
FIG. 2A is a partial top view of a circuit board for transmitting a high speed signal and for the high speed signal to be detected according to an embodiment of this disclosure.
Figure 2B:
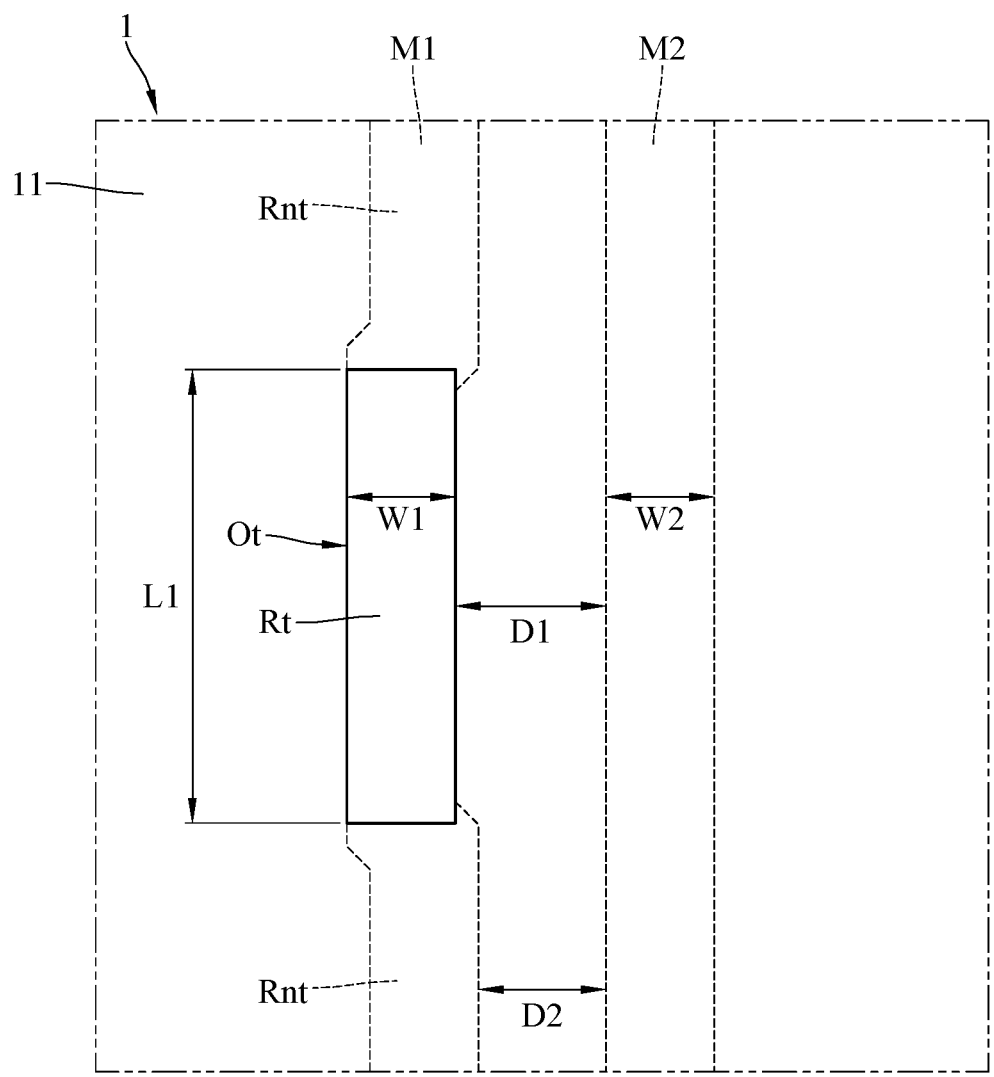
FIG. 2B is a drawing of partial enlargement of the circuit board of FIG. 2A.
Figure 2C:
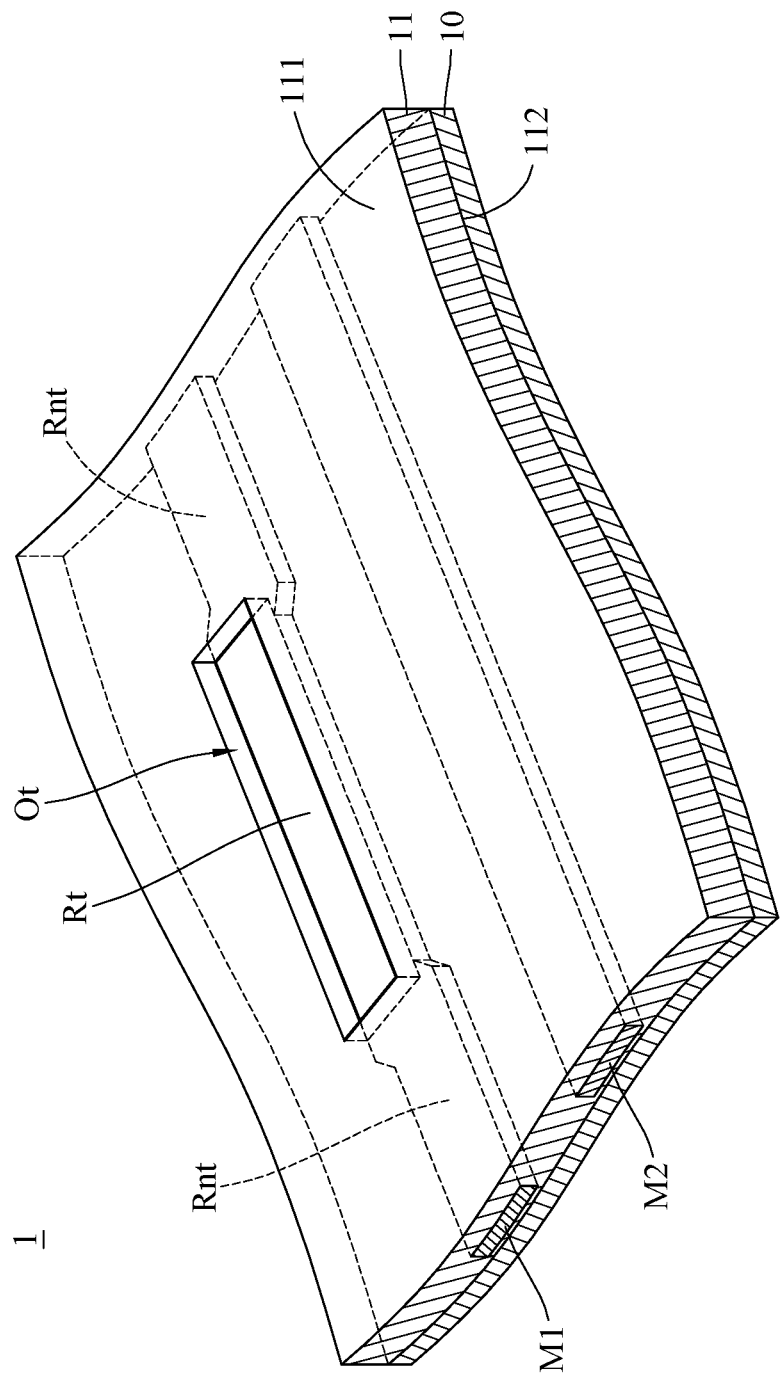
FIG. 2C is a stereogram of the circuit board of FIG. 2B.

Please refer to FIG. 1 and FIGS. 2A-2C to explain the structure of a circuit board 1 for transmitting a high speed signal and for the high speed signal to be detected according to an embodiment of this disclosure. FIG. 2A is a partial top view of the circuit board 1; FIG. 2B is a drawing of partial enlargement of the circuit board 1 of FIG. 2A; FIG. 2C is a stereogram of the circuit board 1 of FIG. 2B. FIG. 2A exemplarily illustrates the arrangement of a part of the metal printed wires M1 and M2 on the circuit board 1. In this embodiment, at least one of the metal printed wires M1 and M2 comprises a test section Rt from which the high speed signal is detected, and the section excluding the test section Rt is defined as a non-test section Rnt.

FIGS. 2B and 2C respectively show the drawing of partial enlargement and the stereogram of the area bordered with dot-and-dash line in FIG. 2A, so as to illustrate the structure and size design of the circuit board 1. As shown in the figures, the circuit board 1 comprises a substrate 10, an insulating layer 11 and two metal printed wires M1 and M2. The substrate 10 can be paper substrate (e.g. FR-1, FR-2, FR-3), epoxy glass cloth substrate (e.g. FR-4, FR-5), composite substrate or substrate formed by other insulating material, which is not limited in this disclosure. The insulating layer 11 can be formed by a solder mask or other insulating material, and is disposed on the substrate 10. The insulating layer 11 comprises a first surface 111, a second surface 112 and a testing opening Ot which passes through the first surface 111 and is formed above the second surface 112. The first surface 111 is defined as the surface facing away from the substrate 10, and the second surface 112 is defined as the surface facing the substrate 10. In other words, the distance between the first surface 111 of the insulating layer 11 and the substrate 10 is larger than that between the second surface 112 and the substrate 10.

The two metal printed wires M1 and M2 of the circuit board 1 are embedded in the insulating layer 11 between the first surface 111 and the second surface 112, and at least one of the metal printed wires M1 and M2 comprises a test section Rt aligned to the aforementioned test opening Ot of the insulating layer 11 and exposed by the test opening Ot. In other words, the test opening Ot can expose the test section Rt for a test probe to electrically contact to the test section Rt so as to perform a high speed signal test. For example, solder paste can be disposed on the test section Rt exposed by the test opening Ot for a conductor (e.g. needle bed) to perform the test by contacting with the solder paste.

In the embodiment as shown in FIGS. 2A-2C, for the convenience of explanation, the metal printed wires M1 is further defined as the first metal printed wire M1 and the metal printed wires M2 is further defined as the second metal printed wire M2; that is, the metal printed wires M1 and M2 comprises the first metal printed wire M1 and the second metal printed wire M2. The first metal printed wire M1 comprises a test section Rt and a non-test section Rnt, with the test section Rt aligned to the test opening Ot of the insulating layer 11, the non-test section Rnt misaligned to the test opening Ot, and the second metal printed wire M2 also misaligned to the test opening Ot. In other words, the test opening Ot merely exposes the test section Rt of the first metal printed wire M1, and the non-test section Rnt of the first metal printed wire M1 and the second metal printed wire M2 are covered by the insulating layer 11.

There is one or more turning corners at the boundary between the test section Rt and the non-test section Rnt of the first metal printed wire M1 so as to form the circuit arrangement in which the distance D1 between the test section Rt of the first metal printed wire M1 and the second metal printed wire M2 is larger than the distance D2 between the non-test section Rnt and the second metal printed wire M2. For example, the distance D1 is 1.1-1.8 times of the distance D2; and in this embodiment, the length L1 of the test section Rt of first metal printed wire M1 is larger than the distance D2 between the non-test section Rnt and the second metal printed wire M2. More specifically, the length L1 of the test section Rt is 2.5-3.5 times of the distance D2 between the non-test section Rnt and the second metal printed wire M2. Moreover, in this embodiment, the line width W1 of the test section Rt of the first metal printed wire M1 can be identical to the line width W2 of the non-test section Rnt.

More particularly, when there are two metal printed wires spaced a constant distance apart and one of them has a section without being covered by the insulating layer, the characteristic impedance of the section without being covered the insulating layer is less than that of any other section being covered by the insulating layer; it causes the inconsistent of the impedance of the metal printed wires, so that the signal may be reflected during the transmission, and the transmission quality of the high speed signal, the stability of the whole device, and even the read/write speed may be decreased. Accordingly, by increasing the distance D1 between the section, without being covered by the insulating layer 11 (i.e. test section Rt), of the first metal printed wire M1 and the second metal printed wire M2 to be larger than the distance D2 between the section being covered (i.e. non-test section Rnt) of the first metal printed wire M1 and the second metal printed wire M2, so as to reduce the mutual capacitance between the section without being covered by the insulating layer 11 and the second metal printed wire M2, and then the characteristic impedance of the section without being covered by the insulating layer 11 is increased to be similar to the characteristic impedance of the section being covered by the insulating layer 11; thereby, the incidence of impedance inconsistence may be reduced, so that the metal printed wires with a test section may still have a great transmission quality.

Moreover, in this embodiment, the circuit board 1 can further comprise solder paste besides the substrate 10, the insulating layer 11 and the two metal printed wires M1 and M2. The solder paste can be disposed on the test section Rt of the first metal printed wire M1 which is exposed by test opening Ot, so as to be conductively connected with the test section Rt; thereby, a test probe can perform a high speed signal test by contacting the solder paste.

Figure 3A:
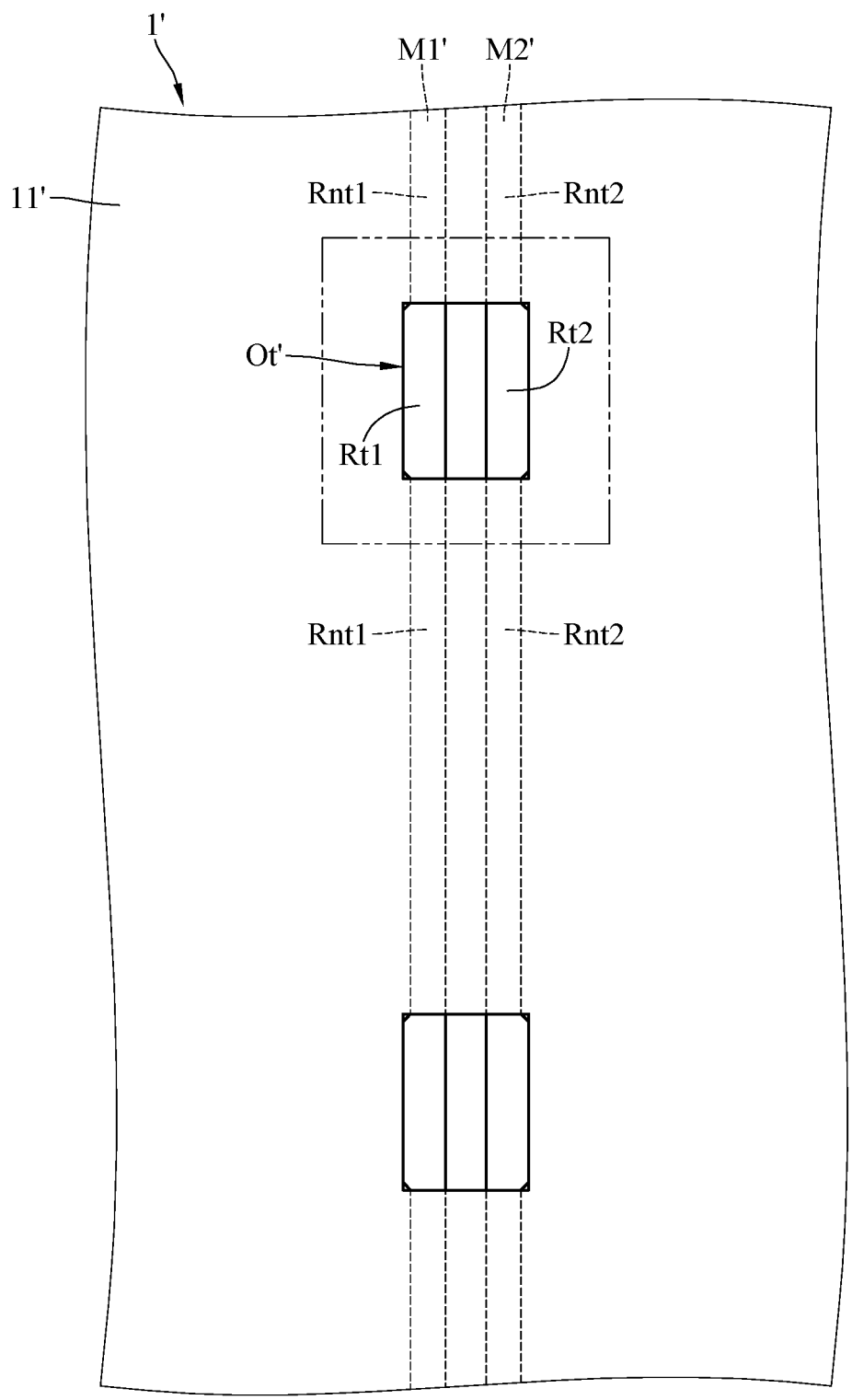
FIG. 3A is a partial top view of a circuit board for transmitting a high speed signal and for the high speed signal to be detected according to another embodiment of this disclosure.
Figure 3B:
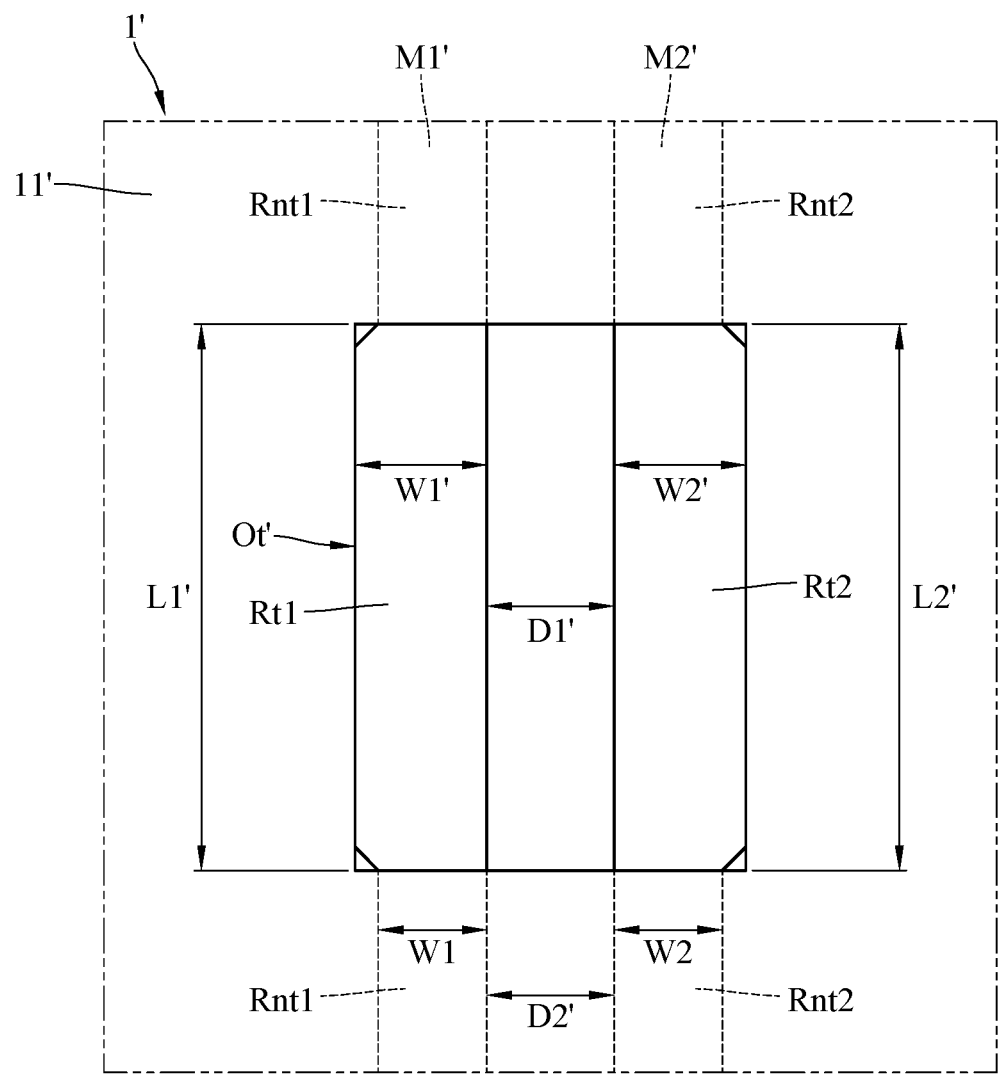
FIG. 3B is a drawing of partial enlargement of the circuit board of FIG. 3A.
Figure 3C:
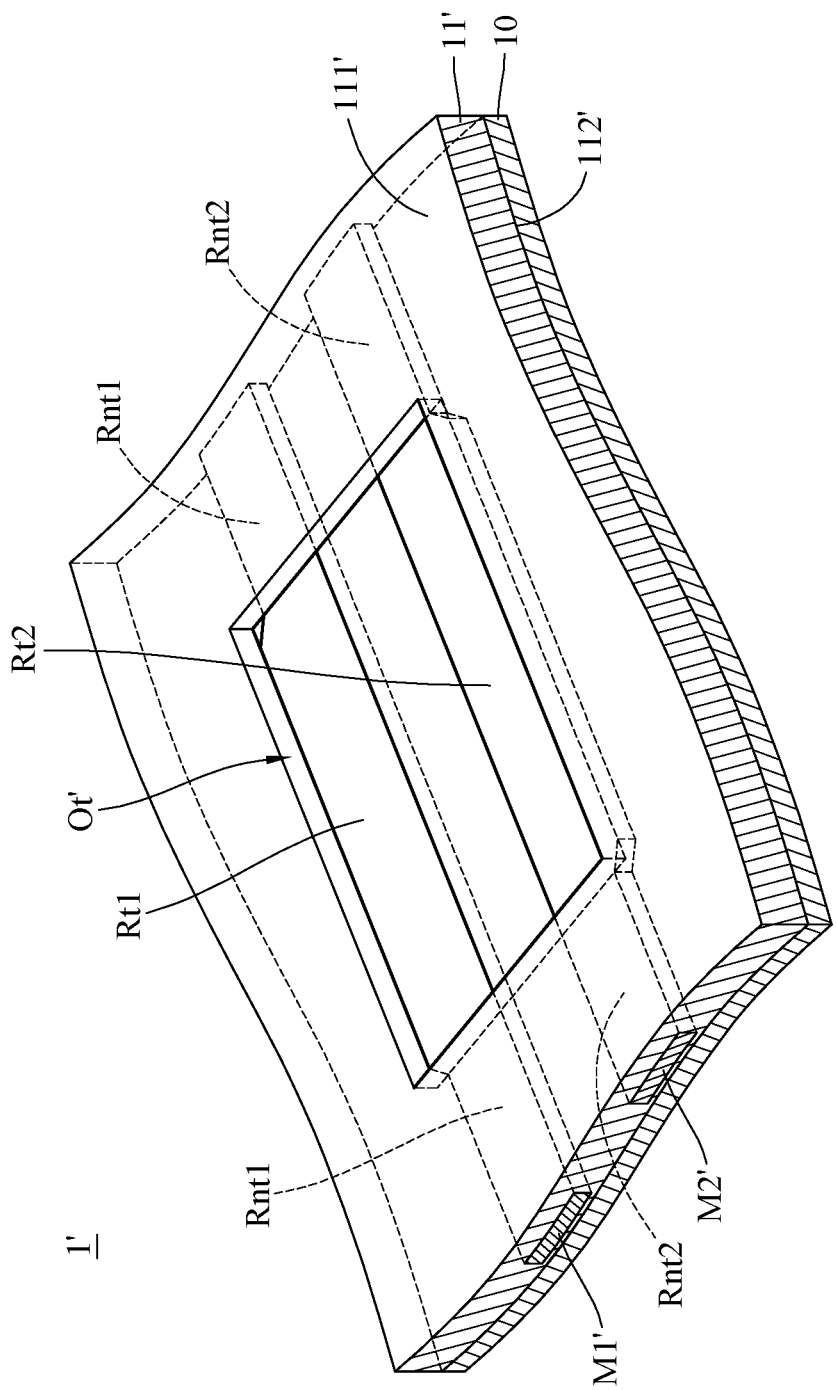
FIG. 3C is a stereogram of the circuit board of FIG. 3B.

Please refer to FIG. 1 and FIGS. 3A-3C to explain the structure of a circuit board 1' for transmitting a high speed signal and for the high speed signal to be detected according to another embodiment of this disclosure. FIG. 3A is a partial top view of the circuit board 1'; FIG. 3B is a drawing of partial enlargement of the circuit board 1' of FIG. 3A; FIG. 3C is a stereogram of the circuit board 1' of FIG. 3B. FIG. 3A exemplarily illustrates the arrangement of a part of the metal printed wires M1' and M2' on the circuit board 1'. In this embodiment, the metal printed wires M1' and M2' respectively comprise test sections Rt1 and Rt2, and the sections excluding the test sections Rt1 and Rt2 in the metal printed wires M1' and M2' are defined as non-test sections Rnt1 and Rnt2.

FIGS. 3B and 3C respectively show the drawing of partial enlargement and the stereogram of the area bordered with dot-and-dash line in FIG. 3A, so as to illustrate the structure and size design of the circuit board 1'. As shown in the figures, the circuit board 1' comprises a substrate 10, an insulating layer 11' and two metal printed wires M1' and M2'. Similar to the circuit board 1 in the aforementioned embodiment, the substrate 10 of the circuit board 1' can be paper substrate (e.g. FR-1, FR-2, FR-3), epoxy glass cloth substrate (e.g. FR-4, FR-5), composite substrate or substrate formed by other insulating material, which is not limited in this disclosure. The insulating layer 11' can be formed by a solder mask or other insulating material, and is disposed on the substrate 10. The insulating layer 11 comprises a first surface 111', a second surface 112' and a testing opening Ot' which passes through the first surface 111' and is formed above the second surface 112'. The first surface 111' is defined as the surface facing away from the substrate 10, and the second surface 112' is defined as the surface facing the substrate 10. In other words, the distance between the first surface 111' of the insulating layer 11' and the substrate 10 is larger than that between the second surface 112' and the substrate 10.

For the convenience of explanation, the metal printed wires M1' is defined as the first metal printed wire M1' and the metal printed wires M2' is defined as the second metal printed wire M2' in the following; that is, the metal printed wires M1' and M2' comprise the first metal printed wire M1' and the second metal printed wire M2'. In the embodiment as shown in FIGS. 3A-3C, as described previously, the first metal printed wire M1' and the second metal printed wire M2' respectively comprise the test sections Rt1 and Rt2 and the non-test sections Rnt1 and Rnt2, wherein the test section Rt1 of the first metal printed wire M1' and the test section Rt2 of the second metal printed wire M2' are together aligned to the test opening Ot'. More specifically, the test opening Ot' simultaneously exposes the test section Rt1 of the first metal printed wire M1' and the test section Rt2 of the second metal printed wire M2'. On the other hand, the non-test section Rnt1 of the first metal printed wire M1' and the non-test section Rnt2 of the second metal printed wire M2' are misaligned to the test opening Ot'.

In this embodiment, the line width W1' of the test section Rt1 of the first metal printed wire M1' is larger than the line width W1 of the non-test section Rnt1 of the first metal printed wire M1', and the line width W2' of the test section Rt2 of the second metal printed wire M2' is larger than the line width W2 of the non-test section Rnt2 of the second metal printed wire M2'. More specifically, there is one or more turning corners at the boundary between the test section Rt1 and the non-test section Rnt1 of the first metal printed wire M1', and there is also one or more turning corners at the boundary between the test section Rt2 and the non-test section Rnt2 of the second metal printed wire M2', so as to form the aforementioned circuit arrangement in which the line width W1' of the test section Rt1 is larger than that of the line width W1 of the non-test section Rnt1, and the line width W2' of the test section Rt2 is larger than that of the line width W2 of the non-test section Rnt2.

For example, the line width W1' of the test section Rt1 of the first metal printed wire M1' is 1.18-1.33 times of the line width W1 of the non-test section Rnt1 of the first metal printed wire M1'; and the length L1' of the test section Rt1 of the first metal printed wire M1' is 3.5-5 times of the line width W1 of the non-test section Rnt1 of the first metal printed wire M1'. In this embodiment, the length L1' of the test section Rt1 of the first metal printed wire M1' can be identical to the length L2' of the test section Rt2 of the second metal printed wire M2', and the ratio of the line width W2' of the test section Rt2 to the line width W2 of non-test section Rnt2 of the second metal printed wire M2' and the ratio of the length L2' of the test section Rt2 to the line width W2 of the non-test section Rnt2 can be the same as those of the first metal printed wire M1'. Moreover, the distance D1' between the test section Rt1 of the first metal printed wire M1 and the test section Rt2 of the second metal printed wire M2 can be identical to the distance D2' between the non-test section Rnt1 of the first metal printed wire M1 and the non-test section Rnt2 of the second metal printed wire.

More specifically, the test opening Ot' in the above embodiment simultaneously expose the test section Rt1 of the first metal printed wire M1 and the test section Rt2 of the second metal printed wire M2, so that the first metal printed wire M1 and the second metal printed wire M2 have a similar or the same circuit arrangement, and may further have the better transmission performance of a high speed signal than those with different circuit arrangements have. In practice, when each of two metal printed wires has a consistent line width from beginning to end, the part of the two meal printed wires which is exposed by the test opening and not covered by the insulating layer has the larger characteristic impedance than the other part of the two meal printed wires which is covered by the insulating layer has. Therefore, by increasing the line width in the part of the two meal printed wires which is not covered by the insulating layer to be larger than the line width in the part of the two meal printed wires which is covered by the insulating layer, the characteristic impedance of the part of the two meal printed wires which is not covered by the insulating layer may be adjusted to be similar to the characteristic impedance of the part of the two meal printed wires which is covered by the insulating layer.

In particular, the ratio of the spacing (distance) between the metal printed wires or the line width of the metal printed wires in the aforementioned embodiments is designed by comparing the signal transmission efficiency among multiple pairs of metal printed wires having different spacing ratios and line width ratios based on their "insertion loss", "return loss" and "time domain reflectomery (TDR)" parameters of S parameters which are the indices of high speed signal transmission, so as to obtain the spacing ratio or line width ratio of the metal printed wires having the more ideal S parameters (i.e. having the better signal transmission efficiency). The insertion loss parameter indicates the ratio of the remaining strength of the signal after being transmitted from the input end to the output end of the metal printed wires to the original strength of the signal when being inputted, wherein the ideal value of the insertion loss parameter is 1; the return loss parameter indicates the percentage of the signal being reflected and not successfully transmitted to the output end, wherein the ideal value of the return loss parameter is 0; the TDR parameter indicates the characteristic impedance of the metal printed wires, wherein the ideal value of the TDR parameter in the baseband of 8 GHz and based on the high speed signal standard such as PCIE4.0 is 85 ohm.

Moreover, in this embodiment, the circuit board 1' can further comprise solder paste besides the substrate 10, the insulating layer 11' and the two metal printed wires M1' and M2'. The solder paste can be disposed on the test section Rt1 of the first metal printed wire M1' or the test section Rt2 of the second metal printed wire M2' which is not covered by the insulating layer 11', so as to be conductively connected with the test section Rt1 or Rt2 where the solder paste is disposed; thereby, a test probe can perform a high speed signal test by contacting the solder paste.

In view of the implementation of the above embodiments, the circuit board for transmitting a high speed signal and for the high speed signal to be detected in this disclosure may reduce the incidence of impedance inconsistence by the structure of open solder mask and the corresponding adjustment of the spacing ratio or the line width ratio of the metal printed wires, so that the metal printed wires with a test section may still have a great transmission quality. The circuit board in this disclosure provides a platform where a high speed signal test is performed, so as to determine whether a problem occurs during the fabrication process, such as short circuits between the signal wires, open circuits in the metal printed wires, or missing parts, offsets, faulty parts or damages of the serial components, or other factors impact on the high speed signal being transmitted. Moreover, in comparison with the conventional functional test, the high speed signal test using the circuit board provided in this disclosure may find the aforementioned problem more accurately and quickly, which may considerably reduce the manpower, cost and resources of the factory, and indirectly improve the production yield rate of the factory in the same limited time.

What is claimed is:

1. A circuit board for transmitting a high speed signal and for the high speed signal to be detected, comprising:
a substrate;
an insulating layer disposed on the substrate in a first direction, and comprising a first surface, a second surface and a test opening, with the first surface facing away from the substrate, the second surface facing the substrate, and the test opening passing through the first surface and formed above the second surface; and
two metal printed wires configured to transmit the high speed signal and embedded in the insulating layer between the first surface and the second surface, with at least one of the metal printed wires comprising a test section which is aligned to the test opening of the insulating layer and exposed by the test opening;
wherein the two metal printed wires comprise a first metal printed wire and a second metal printed wire, the first metal printed wire comprises the test section and a non-test section connecting with each other in a second direction, the non-test section of the first metal printed wire and the second metal printed wire are misaligned to the test opening, a distance between the test section and the second metal printed wire in a third direction is larger than a distance between the non-test section and the second metal printed wire in the third direction;
wherein the second direction is not parallel to the first direction and not parallel to the third direction.

2. The circuit board according to claim 1, wherein a line width of the test section is identical to a line width of the non-test section.

3. The circuit board according to claim 1, wherein the distance between the test section of the first metal printed wire and the second metal printed wire is 1.1-1.8 times of the distance between the non-test section and the second metal printed wire.

4. The circuit board according to claim 3, wherein a length of the test section of the first metal printed wire is 2.5-3.5 times of the distance between the non-test section and the second metal printed wire.

5. The circuit board according to claim 1, further comprising solder paste disposed on the test section to be conductively connected with the test section.

6. A circuit board for transmitting a high speed signal and for the high speed signal to be detected, comprising:
a substrate;
an insulating layer disposed on the substrate, and comprising a first surface, a second surface and a test opening, with the first surface facing away from the substrate, the second surface facing the substrate, and the test opening passing through the first surface and formed above the second surface; and
two metal printed wires configured to transmit the high speed signal and embedded in the insulating layer between the first surface and the second surface, with at least one of the metal printed wires comprising a test section which is aligned to the test opening of the insulating layer and exposed by the test opening;
wherein the two metal printed wires comprise a first metal printed wire and a second metal printed wire, each of the first metal printed wire and the second metal printed wire comprises the test section and a non-test section, the non-test section of the first metal printed wire and the non-test section of the second metal printed wire are misaligned to the test opening, a line width of the test section of the first metal printed wire is larger than a line width of the non-test section of the first metal printed wire, and a line width of the test section of the second metal printed wire is larger than a line width of the non-test section of the second metal printed wire.

7. The circuit board according to claim 6, wherein a distance between the test section of the first metal printed wire and the test section of the second metal printed wire is identical to a distance between the non-test section of the first metal printed wire and the non-test section of the second metal printed wire.

8. The circuit board according to claim 6, wherein the test section of the first metal printed wire and the test section of the second metal printed wire have an identical length.

9. The circuit board according to claim 6, wherein the line width of the test section of the first metal printed wire is 1.18-1.33 times of the line width of the non-test section of the first metal printed wire.

10. The circuit board according to claim 9, wherein a length of the test section of the first metal printed wire is 3.5-5 times of the line width of the non-test section of the first metal printed wire.

11. The circuit board according to claim 6, further comprising solder paste disposed on the test section of the first metal printed wire or the second metal printed wire to be conductively connected with the test section where the solder paste is disposed.

\* \* \* \* \*